United States Patent

Garnier et al.

[15] 3,686,533

[45] Aug. 22, 1972

[54] HEAT SINK MOUNTING ARRANGEMENT FOR INTEGRATED CIRCUITS

[72] Inventors: Michel Garnier, Lannion; Jacques Bigou, Lezardrieux, both of France

[73] Assignee: Societe Lannionaise D'Electronique, Lannion, France

[22] Filed: Aug. 4, 1971

[21] Appl. No.: 169,028

[30] Foreign Application Priority Data

Aug. 4, 1970 France......................7028791

[52] U.S. Cl...............................317/100, 174/DIG. 3

[51] Int. Cl...............................................H05k 7/20

[58] Field of Search............317/100, 101 CC, 234 A; 174/DIG. 3, DIG. 5, 15 R, 16 R

[56] References Cited

UNITED STATES PATENTS 3,327,180 6/1967 Winter......................317/100

*Primary Examiner*—Lewis H. Myers
*Assistant Examiner*—Gerald P. Tolin
*Attorney*—Craig and Antonelli

[57] ABSTRACT

Mounting arrangement for integrated circuits having cooling pins protruding therefrom which also provide for the connection of a power source to the circuits, the pins protruding through a printed circuit board to a side thereof having a plurality of conductive studs which are soldered to the protruding pins, and a metal plate being removably secured to the ends of the conductive studs.

6 Claims, 1 Drawing Figure

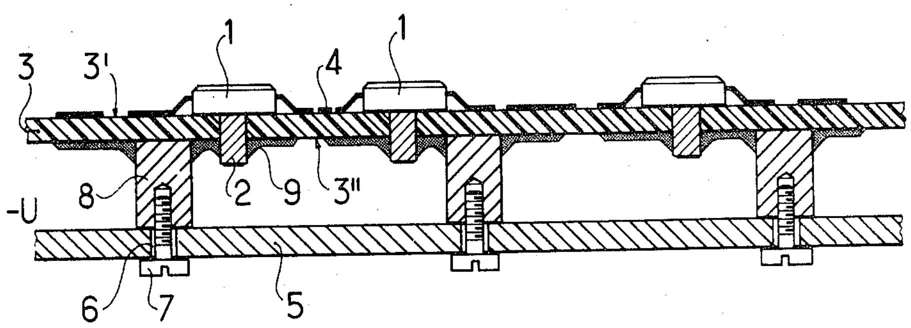
INVENTORS
MICHEL GARNIER, JACQUES BIGOU
BY Craig, Antonelli & Hill
ATTORNEYS

HEAT SINK MOUNTING ARRANGEMENT FOR INTEGRATED CIRCUITS

The present invention relates to the field of integrated electronic circuitry. In particular, it relates to a mounting arrangement for integrated circuits having a small pin embedded with its head in the substrate (silicon) of the integrated circuit, the protruding shaft of the pin serving both as a supply lead for DC power and as a heat conductor for cooling purposes. This mounting arrangement, which is both simple and efficient, can be used in connection with a variety of integrated circuit applications in communications, logic circuitry, and the like, and especially where high-speed operation is involved.

Integrated circuits are normally supplied in the form of small blocks. A very widely used version, for example, is available as a block measuring 6.4 by 3.8 mm and 2 mm thickness, with seven connecting leads on each side thereof. The block includes a small pin of copper or copper alloy with its head embedded in the silicon block and its shaft portion depending from the lower side of the block.

The purpose of the pin embedded in the semiconductor block is a twofold one. Firstly, by being electrically connected to one of the terminals of the current-supplying battery, it assures a continuous supply of electricity to the circuit; and secondly, it serves to cool the block by conducting to the outside surface thereof the caloric energy which is being created by the operation of the integrated circuit encapsulated in the block.

However, as the source of these circuits consume several hundred milliwatts, the pin alone acting as a heat sink does not provide adequate cooling. It then becomes necessary to couple it to a radiator. Thus, the general problem to be solved by the invention is to provide a mounting arrangement for an integrated circuit block of the above-mentioned type on a printed circuit board, where the blocks are coupled to a heat radiator.

Some solutions to this problem have already been suggested in the prior art, but none of these known suggestions have proven to be very satisfactory. According to one suggestion, a sheet of copper of a thickness between 1 and 2 mm is applied against one face of the circuit board. The printed circuit is arranged on the other face of the board, the shaft of each pin passing through the board and through the copper plate. Between the pin and the copper plate is established a connection for both electrical and thermal conduction, using soldering, for example. It is easily seen that this mode of assembly makes it impossible for any circuit connections to be arranged on the second face of the circuit board; and because high-speed circuitry of this kind normally requires at least two layers of printed circuitry connections, this arrangement makes it necessary to have multilayer printed circuit boards which are very costly. Thus, this solution is economically undesirable.

Furthermore, the cooling effect obtained is less than excellent unless an additional radiator is provided in conjunction with the copper plate mentioned.

Lastly, it should be noted that this mode of assembly requires great accuracy in the positioning of the pin holes in the copper plate in order to assure proper positioning of the IC blocks and good solderability between the pins and the plate.

Another suggested solution calls for mounting the integrated circuit blocks upside-down, with the pins extending away from the printed circuit board. As a number of IC blocks are normally arranged on one circuit board, a copper plate can be placed against the extremities of the pins and connected to each pin face by suitable means.

One shortcoming of this arrangement is the fact that it is difficult to obtain good electrical contact between the plate and the pins with absolute certainty. Also, there is no assurance that the assembly will preserve its properties over an extended period of time, regardless of the position of the printed circuit (due to deflection of the circuit board, oxidation, etc.).

Furthermore, the circuitry itself is covered by the copper plate, and therefore, access to the control points on the circuitry is made difficult.

Lastly, the source impedance at high frequency of these circuits is too high, thereby causing serious problems such as mismatching and noise.

Additional solutions have been suggested where metallic tongues connect the pins to one another; however, this version has a low degree of heat evacuation. Also, the advantage of a homogeneous temperature obtained through use of the continuous copper plate, which produces a reduction of the noise level, is lost. Again, the source impedance at HF is too high.

The above-mentioned shortcomings of the known mounting arrangements are obviated by the arrangement suggested by the present invention, where the copper plate which serves as a radiator is affixed to the free extremities of several threaded studs whose other extremities are soldered to one face of the printed circuit board, the integrated circuits being attached to the other face of the board.

The invention will be better understood and its advantages will become more apparent from the following detailed description, with reference to the drawing, which shows, by way of an example, a mounting arrangement for integrated circuits on a printed circuit board embodying the invention.

In the drawing, the integrated circuit blocks 1 comprise a pin whose shaft 2 protrudes from the block, the leads of the integrated circuits 1 being connected to the upper face 3' of a printed circuit board 3, shown in cross section. Among other printed circuitry elements, a connecting path is shown at 4. To the lower face 3'' of the board are soldered a plurality of threaded studs 8 which hold a copper plate 5 attached to the studs 8 by means of screws 7, or other suitable fasteners, reaching through corresponding holes 6 in the plate 5. The pin shafts 2 protrude from the lower face 3'' of the board 3 and are enveloped by the solder connection 9 which also attaches the threaded studs 8 to the board. In most cases, the electrically and thermally connected assembly of plate, studs and pins is connected to the negative terminal −U of the current source.

The mounting arrangement of the invention has the following advantages:

a. It ensures a lower electrical source impedance at a high frequency for all integrated circuits due to the good contact between the −5.2V and the pins (2).

b. It ensures a good dissipation of the heat generated, the thermal resistance being low and the radiating surface being very large.

c. The soldering connection 9 which serves as a lead offers a low HF-impedance to the other flow of alimentation, thus satisfying the requirement of a low alimentation impedance.

d. It makes possible the use of conventional printed circuit boards, either of the double-faced type, or multilayer type.

e. It provides for an optimum separation of the thermal parameters from the electronic parameters.

f. It allows for easy and safe removal of an integrated circuit which may be malfunctioning.

g. It permits wide tolerances in the drilling coordinates for the holes in the circuit board, and for this reason, offers economies of production.

h. It gives the assembled structure a great mechanical rigidity.

i. By balancing the temperatures of all the integrated circuits on the board, it improves the immunity of the assembly against noise.

We claim:

1. A mounting arrangement for integrated circuits which include a substrate having a cooling pin protruding from one surface thereof, comprising a printed circuit board having a plurality of holes therein at predetermined positions, said integrated circuits being mounted on said circuit board with the cooling pins thereof protruding through said holes, a plurality of metal studs affixed on the surface of said circuit board opposite the side on which said integrated circuits are mounted and electrically connected to at least one of said protruding cooling pins, and a conductive plate removably fastened to the free extremities of said metal studs.

2. A mounting arrangement as defined in claim 1 wherein said cooling pins also serve as means for connecting direct current power to said integrated circuits and further including a direct current power source connected to said conductive plate.

3. A mounting arrangement as defined in claim 2 wherein said conductive plate is secured to said metal studs by threaded connection.

4. A mounting arrangement as defined in claim 1 wherein said metal studs are soldered to said board, the solder connection forming a connecting neck surrounding at least one pin.

5. A mounting arrangement as defined in claim 4 wherein said cooling pins also serve as means for connecting direct current power to said integrated circuits and further including a direct current power source connected to said conductive plate.

6. A mounting arrangement as defined in claim 5 wherein said metal studs each have threaded holes in the ends thereof and said conductive plate is fastened to said studs by screws engaging in said threaded holes.

* * * * *